United States Patent [19]

Roesner

[11] 4,377,856
[45] Mar. 22, 1983

[54] STATIC SEMICONDUCTOR MEMORY WITH REDUCED COMPONENTS AND INTERCONNECTIONS

[75] Inventor: Bruce B. Roesner, San Diego, Calif.

[73] Assignee: Burroughs Corporation, Detroit, Mich.

[21] Appl. No.: 178,301

[22] Filed: Aug. 15, 1980

[51] Int. Cl.³ .............................................. G11C 11/40
[52] U.S. Cl. .................................... 365/154; 307/279
[58] Field of Search ................. 365/154; 307/279, 291

[56] References Cited

U.S. PATENT DOCUMENTS

| 3,573,499 | 4/1971 | Lynes | 365/154 |
| 3,610,967 | 10/1971 | Palfi | 365/154 |
| 3,949,385 | 4/1976 | Sonoda | 365/154 |

OTHER PUBLICATIONS

Klepp et al., "Circuit Useable as Storage Cell or Detector-Amplifier Cell", IBM Tech. Disc. Bul., vol. 15, No. 5, 10/72, pp. 1720–1721.
Gaensslen, "FET Diode Stored Charge Memory Cell", IBM Tech. Disc. Bul., vol. 11, No. 8, 1/69, pp. 997–998.
Wiedmann, "Monolithic Memory Cell", IBM Tech. Disc. Bul., vol. 13, No. 5, 10/70, pp. 1362–1363.

*Primary Examiner*—Stuart N. Hecker
*Attorney, Agent, or Firm*—Charles J. Fassbender; J. Ronald Richebourg; Kevin R. Peterson

[57] ABSTRACT

Disclosed is a static semiconductor memory which is comprised of a pair of cross-coupled switching means forming a set-node, a reset-node, and a common-node; and a pair of variable conductance means. Each of the variable conductance means are characterized as having first and second terminals with negligible conductance therebetween when the voltage thereacross is less than a predetermined breakdown level, and as having substantial conductance when the voltage thereacross exceeds the breakdown level. The first terminals of the pair of variable conductance means are coupled respectively to the set-node and reset-node. A pair of bit lines are coupled respectively to the second terminals on the pair of variable conductance means; and a word line is coupled to the common-node.

13 Claims, 3 Drawing Figures

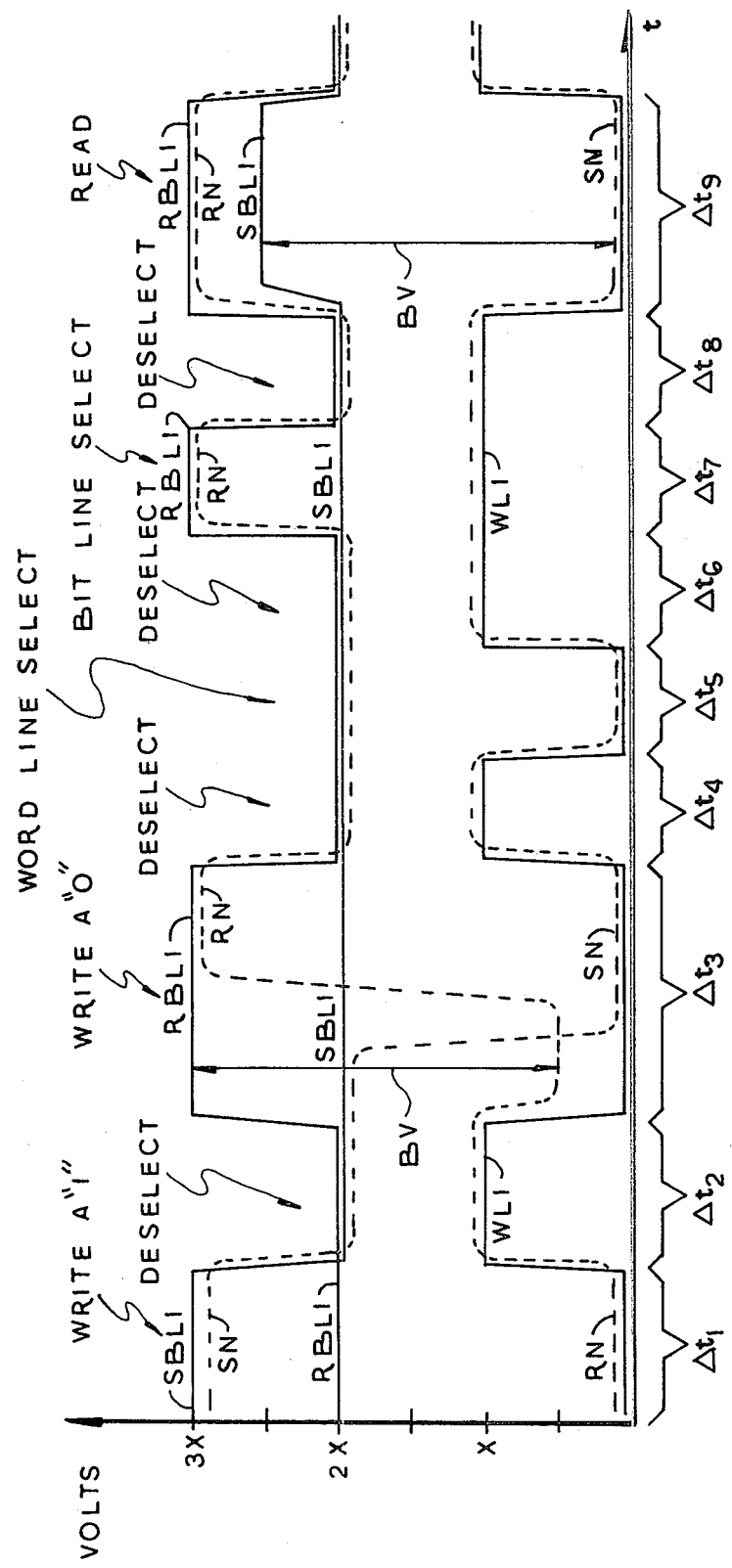

STATIC SEMICONDUCTOR MEMORY WITH REDUCED COMPONENTS AND INTERCONNECTIONS

BACKGROUND OF THE INVENTION

This invention relates to digital memories; and more particularly to, static digital memories on a semiconductor substrate.

Basically, static semiconductor memories are defined as those memories wherein stored information will remain indefinitely without the aid of any "refresh cycles", so long as power is supplied to the memory. By comparison, dynamic semiconductor memories must be refreshed periodically; otherwise, the information stored in the memories will dissipate. Typically, the refresh rate for a dynamic semiconductor memory is on the order of several hundred times per second.

Thus, since static semiconductor memories require no refresh cycles (and no associated control circuitry), they are often preferred over dynamic memories as the storage means in many digital systems. However, static semiconductor memories typically require more physical space for their layout on a semiconductor chip than do dynamic memories. Accordingly, a disadvantage of the static semiconductor memory is that the number of static memory cells per chip is generally less than the number of dynamic memory cells per chip.

To overcome this problem, both the number of components per static memory cell and the number of interconnections between the cells must be minimized. However, in the past, a single static memory cell typically included at least six components, and had at least five interconnecting nodes between cells. These will subsequently be pointed out in conjunction with the description of FIG. 2. Dynamic memories, by comparison, typically include only two components per cell (a storage capacitor and a transfer gate); and have only three interconnecting nodes per cell (one node for connection to a bit line, one node for connection to a word line, and one node for connection to a supply voltage bus).

Accordingly, a primary object of this invention is to provide a static semiconductor memory having a reduced number of components and interconnections per cell over the prior art.

BRIEF SUMMARY OF THE INVENTION

These and other objectives are accomplished in accordance with the invention by a static semiconductor memory which is comprised of a pair of cross-coupled switching means forming a set-node, reset-node, and a common-node; and a pair of variable conductance means. Each of the variable conductance means are characterized as having first and second terminals with negligible conductance therebetween when the voltage thereacross is less than predetermined breakdown level, and as having substantial conductance when the voltage thereacross exceeds the breakdown level. The first terminals of the pair of variable conductance means are coupled respectively to the set-node and reset-node. A pair of bit lines are coupled respectively to the second terminals on the pair of variable conductance means; and a word line is coupled to the common-node.

In one preferred embodiment, each variable conductance means consists of a Schottky diode. In another preferred embodiment, each variable conductance means consists of a field-effect transistor having an interconnected source and gate. And in still other preferred embodiments, each variable conductance means consists of a Zener diode or an avalanche breakdown diode.

BRIEF DESCRIPTION OF THE DRAWINGS

Various features and advantages of the invention will best be understood by reference to the following detailed description and accompanying drawings wherein:

FIG. 3 is a set of waveforms which illustrate the operation of the FIG. 1 memory.

DETAILED DESCRIPTION

Figure 1:
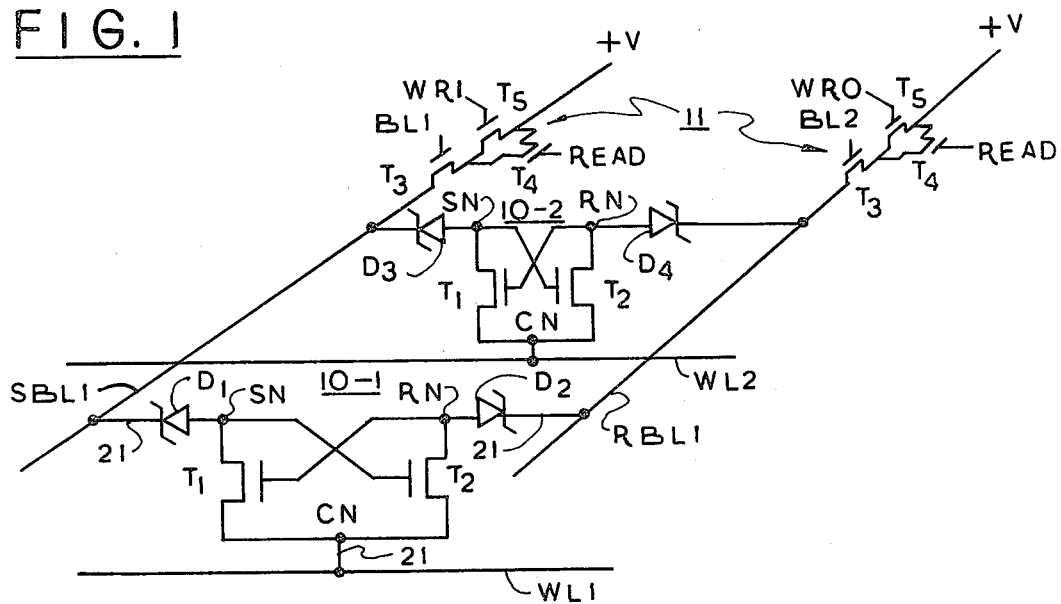
FIG. 1 is a detailed circuit diagram of one preferred embodiment of a memory which is constructed in accordance with the invention.

Referring now to FIG. 1, there is illustrated a detailed circuit diagram of one preferred embodiment of a static semiconductor memory that is constructed in accordance with the invention. Included within that memory are a plurality of memory cells; two of which are indicated via reference numerals 10-1 and 10-2.

Each of the memory cells is formed by a pair of cross-coupled field effect transistors T1 and T2. A set-node SN is formed by the cross-coupling of the gate of transistor T2 with the drain of transistor T1; a reset-node RN is formed by the cross-coupling of the gate of transistor T1 with the drain of transistor T2; and a common-node CN is formed by a connection between the sources of transistors T1 and T2.

Also included in the FIG. 1 memory, are a plurality of word lines and bit lines. Two of those word lines are indicated as WL1 and WL2; and two of those bit lines are indicated as SBL1 and RBL1. With this notation, the "S" stands for "set", and the "R" stands for "reset".

The FIG. 1 memory further includes a plurality of variable conductance means; four of which are indicated as D1, D2, D3, and D4. These variable conductance means are characterized as having a pair of terminals with negligible conductance therebetween when the voltage across the terminals is less than a predetermined breakdown level; and as having substantial conductance therebetween when the voltage across the terminals exceeds the breakdown level.

In one preferred embodiment, each variable conductance means consists of a single Schottky diode. It is formed by the combination of a metal conductor being in contact with an N— polysilicon region which, in turn, is in contact with a N+ region of a single crystal silicon substrate. In another preferred embodiment, each variable conductance means consists of a field-effect transistor having its gate and source connected together. In still other preferred embodiments, each variable conductance means consists of a single Zener diode, or a single avalanche breakdown diode. The illustrated embodiment of FIG. 1 shows the Schottky diode version of the variable conductance means, and thus that means will hereinafter be referred to as a diode for convenience.

Each of the memory cells 10-1 and 10-2 have their set-node and reset-node coupled through a respective pair of diodes to a selected pair of bit lines, and have their common-node coupled to a selected one of the word lines. In the illustrated embodiment, cell 10-1 has its set-node coupled through diode D1 to bit line SBL1, has its reset-node coupled through diode D2 to bit line RBL1, and has its common-node coupled to word line WL1. Memory cell 10-2, by comparison, has its set-node coupled through diode D3 to bit line SBL1, has its reset-node coupled through diode D4 to bit lines RBL1, and has its common-node coupled to word line WL2.

Also illustrated in FIG. 1, is a peripheral circuit 11 which is utilized in writing data to and reading data from the memory cells. This circuit includes groups of three field-effect transistors T3, T4, and T5 which are respectively coupled to the bit lines. The operation of this peripheral circuitry and the memory cells themselves will be described shortly in conjunction with the timing diagram of FIG. 3.

Figure 2:
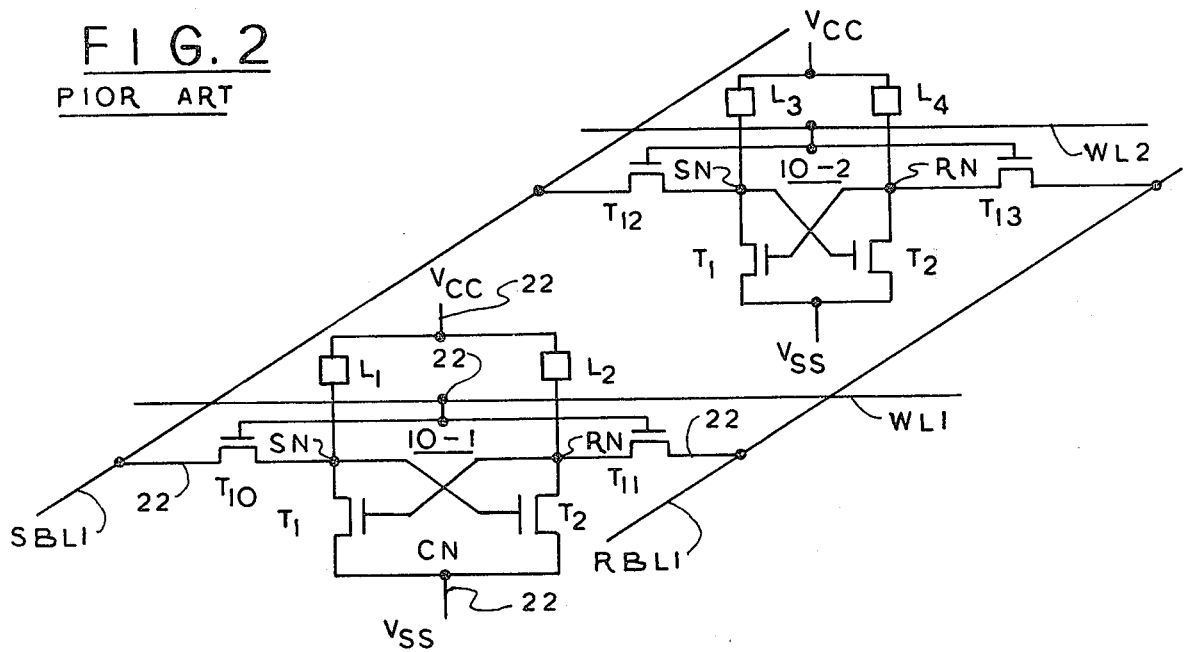
FIG. 2 is a detailed circuit diagram of a memory which is constructed in accordance with the prior art.

However, before preceding with that description, reference should now be made to FIG. 2 wherein a detailed circuit diagram of a static semiconductor memory which is constructed according to the prior art is illustrated. That memory also includes a plurality of cells 10-1 and 10-2, cross-coupled transistors T1 and T2, set and reset nodes SN and RN, bit lines SBL1 and RBL1, and word lines WL1 and WL2. However, there are several substantial differences in the manner in which these components are interconnected in the FIG. 1 and FIG. 2 memories. Further, the FIG. 2 memory contains several additional components which are not in the FIG. 1 memory.

In particular, in the FIG. 2 memory, the set and reset nodes SN and RN are coupled to the bit lines SBL1 and RBL1 through respective pairs of transistors T10, T11, T12, and T13 whose gates are connected to a word line. But in the FIG. 1 memory, the set and reset nodes SN and RN couple to the bit lines SBL1 and RBL1 through respective diodes which are characterized as described above; and the word lines couple to the cells common-node CN.

Also, in the FIG. 2 memory, each of the set and reset nodes Sn and Rn is coupled through a respective load device L1-L4 to a voltage source $V_{cc}$. But in the FIG. 1 memory, these load devices L1-L4 as well as the voltage source and its accompanying voltage bus to each of the cells is eliminated.

Also, in the FIG. 2 memory, the common-node CN of each of the cells is coupled to another voltage source $V_{ss}$ via another voltage bus. But in the FIG. 1 memory, this voltage source and accompanying voltage bus is again eliminated.

Further, a total of six components (e.g., T1, T2, L1, L2, T10, and T11) are required for each memory cell in the FIG. 2 memory; whereas a total of only four components (e.g., T1, T2, D1, and D2) are required for each cell in the FIG. 1 memory. Also, a total of five nodes exist for each cell in the FIG. 2 memory to which cell interconnections must be made; whereas a total of only three nodes exist for each cell in the FIG. 1 memory to which such interconnections must be made. These nodes are indicated by reference numeral 21 in FIG. 1, and by reference numeral 22 in FIG. 2.

Turning now to FIG. 3, the operation of the FIG. 1 static memory will be described. That figure is comprised of a plurality of waveforms which are labelled SN, RN, SBL1, RBL1, and WL1; and they indicate the voltage at corresponding points in the FIG. 1 memory. Also, in FIG. 3, time is plotted on the horizontal axis; and voltage is plotted on the vertical axis.

Note that no particular voltage values are given on the vertical axis. Instead, the voltages are labelled as X, 2X, and 3X; where X can be any value, such as 1 volt for example. In operation, the voltage on word lines WL1 and WL2 is controlled to switch between 0 and X volts; while the voltage on bit lines SBL1 and RBL1 is controlled to switch between 2X and 3X volts. Also, the voltage at which the diodes D1-D4 break down is selected to be between 2X and 3X volts, such as 2.5X volts.

Now in order to write a "1" into a memory cell, the voltage on the set bit line which couples to that cell is raised to 3X volts, and the voltage on the word line which couples to that cell is simultaneously lowered to 0 volts. This is illustrated as occurring for memory cell 10-1 during time interval $\Delta t1$. Under those conditions, the breakdown voltage across diode D1 is exceeded; and thus it becomes highly conductive.

As a result, transistor T2 turns on, and transistor T1 turns off. And since transistor T2 is on, the voltage on reset-node RN is nearly equal to the voltage on the word line WL1. Conversely, since transistor T1 is off, the voltage on set-node SN rises well above the voltage on the word line WL1. This causes diode D1 to come out of its breakdown mode of operation; and then the voltage on set-node SN is determined by the relative leakage currents through diode D1 and transistor T1.

Preferably, the leakage current through diode D1 is substantially greater than the leakage current through transistor T1. For example, diode D1 and transistor T1 can have leakage currents of 40 nanoamperes and 1 nanoampere respectively. Under those conditions, nearly all of the 3X bit line voltage is dropped across transistor T1. In other words, the voltage on set-node SN is approximately equal to the voltage on set bit line SBL1.

Next, to deselect a memory cell, the voltage on both of the bit lines which couple to that cell is lowered to the 2X voltage level; and the voltage on the word line which couples to that cell is raised to the X voltage level. This is illustrated as occurring during time interval $\Delta t2$. Under these conditions, the voltage difference between the bit lines and the word line is only 1X. Thus, the breakdown voltage of diodes D1 and D2 clearly is not exceeded. Accordingly, transistors T1 and T2 respectively remain in their off state and on state. Therefore, the voltage on reset-node RN continues to nearly follow the voltage on word lines WL1; and the voltage on set-node SN continues to follow the voltage on the set bit lines SBL1.

Then, to write a "0" into a memory cell, the voltage on the reset bit line which couples to that cell is raised to the 3X voltage level; and the voltage on the word line which couples to that cell is simultaneously lowered to the 0 voltage level. This is illustrated as occurring during time interval $\Delta t3$. Under those conditions, the voltage difference between reset bit line RBL1 and word line WL1 exceeds the breakdown voltage of diode D2.

Since transistor T2 was turned on (thus having essentially 0 volts dropped across it) the diode D2 breaks down. Thus, the voltage on reset-node RN stops tracking the voltage on word line WL1; and instead, it rises to a level of 3X minus the breakdown voltage. Transistor T2 then goes into saturation.

As the voltage rises on reset-node RN, transistors T1 turns on. Then, due to the cross-coupling between transistors T1 and T2, transistor T2 turns off. This further increases the voltage on reset-node RN; which, in turn, causes diode D2 to come out of breakdown. Under those conditions, the voltage on reset-node RN is determined by the relative magnitudes of leakage current through diode D2 and transistor T2 as was described above.

After this write operation, the memory cell is deselected as previously described. That is, the voltage on both bit lines which couple to the cell is lowered to the 2X voltage level; while the voltage on the word line which couples to the cell is simultaneously raised to the X voltage level. This is illustrated as occurring during time interval Δt4.

Thereafter, other cells which share the same bit lines or same word line as well 10-1 can be written into without disturbing the information which was previously stored in that cell. For example, during time interval Δt5, the voltage on word line WL1 is lowered from X volts to 0 volts; and at the same time, the voltage on other bit lines which couple to selected cell (not shown) could be raised from 2X volts to 3X volts. This, however, will now disturb the state of transistors T1 and T2 in memory cell 10-1 because the voltage between word line WL1 and bit lines SBL1 and RBL1 is less than the breakdown voltage of diodes D1 and D2.

Similarly, when the voltage on one of the bit lines RBL1 and SBL1 is raised from 2X volts to 3X volts while the voltage on the word line WL1 is left at X volts, the information in cell 10-1 will remain unchanged. This is illustrated as occurring during time interval Δt7. Again, the reason why information in cell 10-1 remains unchanged under these conditions is that the voltage between the word line and both of the bit lines which couple to that cell is less than the breakdown voltage of diodes D1 and D2.

Consider next the voltage waveforms of time interval Δt9. During that time interval, the information which is stored in memory cell 10-1 is being read. To accomplish this, the voltage level on word line WL1 is lowered from X volts to 0 volts; while at the same time, the voltage level on bit lines SBL1 and RBL1 is attempted to be raised through a current limiting circuit to the 3X voltage level.

Circuit 11 of FIG. 1 is an illustrated embodiment of a suitable current limiting cirucit. There, transistors T5 are turned on during a write operation, while transistors T4 are turned on during read operation. These transistors are scaled in size such that the saturation current of transistors T5 is greater than the saturation current of transistors T1 and T2; whereas the saturation current of transistors T4 is substantially less than the saturation current of transistors T1 and T2. For example, transistors T5 and T4 may have respective saturation currents of 20 milliamps and 5 milliamps; whereas transistors T1 and T2 have saturation currents of 10 milliamps.

In operation then, when bit line SBL1 is attempted to be raised to the 3X voltage level, the breakdown voltage across diode D1 will be exceeded because transistor T1 is on. But the current through diode D1 will be limited by transistor T4 to a value which is less than the saturation curren of transistor T1. Accordingly, the voltage on set-node SN will remain approximately equal to the voltage on word line WL1. Thus, the voltage on bit line SBL1 will not reach the 3X voltage level; but instead, it will be clamped to the breakdown voltage level of diode D1.

Also, since the voltage on set-node SN continues to track the voltage on word line WL1, transistor T2 remains turned off. Thus, when the voltage on reset bit line RBL1 is attempted to be raised to the 3X voltage level through transistor T4, the voltage across diode D2 will not exceed the breakdown voltage. Thus, only a small leakage current will pass through diode D2 and transistor T2. So the voltage level of reset bit line RBL1 will actually reach the 3X voltage level. Accordingly, the information in cell 10-1 is indicated by the relative voltages on bit lines SBL1 and RBL1.

Various preferred embodiments of the invention have now been described in detail. In addition, however, many changes and modifications can be made to these details without departing from the nature and spirit of the invention. Thus, it is to be understood that the invention is not limited to said details but as defined by the appended claims.

What is claimed is:

1. An improved static semiconductor memory comprised of a plurality of memory cells; each of said memory cells including a pair of cross-coupled switching means forming a set node, a reset node, and a common node; a plurality of word lines coupled respectively to the common node of said memory cells; a set bit line coupled to the set nodes of said cells; and a reset bit line coupled to the reset nodes of said cells; wherein the improvement comprises:
   a first plurality of diodes having respective anodes connected directly to the set node of said cells and having respective cathodes connected directly to said set bit line;
   a second plurality of diodes having respective anodes connected directly to the reset node of said cells and having respective cathodes connected directly to said reset bit line;
   said diodes being the only coupling between said bit lines and said set and reset nodes;
   said diodes having a predetermined reverse bias breakdown voltage level; and
   means for applying a reverse bias voltage between a selected one of said bit lines and a selected one of said word lines which exceeds said breakdown voltage to write information into the memory cell that connects to the selected word line.

2. A memory according to claim 1 wherein each of said switching means has a saturation current, and said means for applying a reverse bias voltage includes a means for supplying a current along with said voltage to said selected one of said bit lines that exceeds said saturation current.

3. A memory according to claim 2 wherein each of said switching means has a leakage current, and each of said diodes also has a leakage current that exceeds the leakage current of said switching means.

4. A memory according to claim 3 which further includes a means for coupling a reverse bias voltage between both of said bit lines and a selected one of said word lines which exceeds said breakdown voltage to read information from the cell that connects to the selected word line.

5. A memory according to claim 4 wherein said means for coupling a reverse bias voltage includes a means for supplying a current along with said voltage to said bit lines that is substantially less than said saturation current.

6. A memory according to claim 5 wherein each of said diodes is a Schottky diode.

7. A memory according to claim 5 wherein each of said diodes is a Zener diode.

8. A memory according to claim 5 wherein said pair of cross-coupled switching means is a pair of cross-coupled field-effect transistors.

9. An improved static semiconductor memory cell including a pair of cross-coupled switching means forming a set node, a reset node, and a common node; a word line coupled to the common node of said memory cell; a set bit line coupled to the set node of said cell; and a reset bit line coupled to the reset node of said cell; wherein the improvement comprises:

a first diode having an anode connected directly to the set node of said cell and having a cathode connected directly to said set bit line;
a second diode having an anode connected directly to the reset node of said cell and having a cathode connected directly to said reset bit line;
said diodes being the only coupling between said bit lines and said set and reset nodes;
said diodes having a predetermined reverse bias breakdown voltage level; and
means for applying a reverse bias voltage between a selected one of said bit lines and said word line which exceeds said breakdown voltage to write information into said memory cell.

10. A memory cell according to claim 9 wherein each of said switching means has a saturation current, and said means for applying a reverse bias voltage includes a means for supplying a current along with said voltage to said selected one of said bit lines that exceeds said saturation current.

11. A memory cell according to claim 10 wherein each of said switching means has a leakage current, and each of said diodes also has a leakage current that exceeds the leakage current of said switching means.

12. A memory cell according to claim 11 which further includes a means for coupling a reverse bias voltage between both of said bit lines and said word line which exceeds said breakdown voltage to read information from said cell.

13. A memory according to claim 12 wherein said means for coupling a reverse bias voltage includes a means for supplying a current along with said voltage to said bit lines that is substantially less than said saturation current.

* * * * *